(12) United States Patent
Hasegawa (10) Patent No.: US 12,187,050 B2
(45) Date of Patent: Jan. 7, 2025

(54) PRINTING APPARATUS

(71) Applicant: SEIKO EPSON CORPORATION, Tokyo (JP)

(72) Inventor: Koki Hasegawa, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 144 days.

(21) Appl. No.: 18/180,893

(22) Filed: Mar. 9, 2023

(65) Prior Publication Data

US 2023/0286307 A1    Sep. 14, 2023

(30) Foreign Application Priority Data

Mar. 11, 2022 (JP) .................................. 2022-037852

(51) Int. Cl.
*B41J 29/02* (2006.01)
*H05K 9/00* (2006.01)

(52) U.S. Cl.
CPC ............ *B41J 29/02* (2013.01); *H05K 9/0007* (2013.01)

(58) Field of Classification Search
CPC ......... B41J 29/02; B41J 29/38; H04N 1/0083; H05K 9/0007
See application file for complete search history.

(56) References Cited

U.S. PATENT DOCUMENTS 9,604,458 B1 * 3/2017 Sugiura .................. B41J 2/1433

FOREIGN PATENT DOCUMENTS

JP    2009-151034 A    7/2009

* cited by examiner

*Primary Examiner* — Justin Seo
(74) *Attorney, Agent, or Firm* — Global IP Counselors, LLP (57) ABSTRACT

A printing apparatus includes: a motor; a printing mechanism; a print processor; a connector; a substrate that transmits a signal received via the connector to the print processor, the print processor and the connector being mounted on the substrate; a plurality of metal plates that separate the substrate from the motor. The metal plates surround the substrate. The cable is coupled to the connector via a through-hole. The through-hole is covered with a metal cover.

5 Claims, 5 Drawing Sheets

PRINTING APPARATUS

The present application is based on, and claims priority from JP Application Serial Number 2022-037852, filed Mar. 11, 2022, the disclosure of which is hereby incorporated by reference herein in its entirety.

BACKGROUND

1. Technical Field

The present disclosure relates to printing apparatuses.

2. Related Art

Printing apparatuses have recently been utilized in a large variety of environments, such as inside houses and offices and thus have been actively developed. JP-A-2009-151034 discloses an electrical substrate support structure that includes: a mechanical main body that retains a main-body substrate; a movable body attachable to or detachable from the mechanical main body; and an exchangeable electrical substrate electrically coupled to the main-body substrate via a connector. The exchangeable electrical substrate is movable in an attachment and detachment directions with a plurality of exchange substrates retained therein. In response to these movements, the exchange substrates become electrically connected to or disconnected from the main-body substrate.

In a typical printing apparatus, a radiation source that generates an electromagnetic wave may be present. For example, a motor that generates power to transport media serves as a radiation source. Moreover, in a printing apparatus, connectors for communication with an external apparatus sometimes pick up noise. Thus, an electromagnetic wave generated by a radiation source, such as a motor, may enter a printing apparatus via connectors and affect the operation as noise.

SUMMARY

The present disclosure is a printing apparatus that includes: a motor; a transport mechanism that transports a medium by virtue of power generated by the motor; a printing mechanism that prints an image on the medium being transported by the transport mechanism; a print processor that controls the motor, the transport mechanism, and the printing mechanism; a connector to which a cable for communicate with an external apparatus is coupled; a substrate that transmits a signal received via the connector to the print processor, the print processor and the connector being mounted on the substrate; a first metal plate that separates the substrate from the motor; a second metal plate disposed above the substrate, the second metal plate having a through-hole; a third metal plate; a fourth metal plate; a fifth metal plate; and a sixth metal plate. The first metal plate to the sixth metal plate surround the substrate. The cable is coupled to the connector via the through-hole. The through-hole is covered with a metal cover.

DESCRIPTION OF EXEMPLARY EMBODIMENTS

A description will be described below of some embodiments of the present disclosure, which are examples of the present disclosure and thus not intended to limit the disclosure. Such embodiments may incorporate various modifications and variations unless the spirit of the present disclosure changes. It should be noted that not all the components that will be described below are essential to the present disclosure.

A printing apparatus according to one embodiment of the present disclosure includes: a motor; a transport mechanism that transports a medium by virtue of power generated by the motor; a printing mechanism that prints an image on the medium being transported by the transport mechanism; a print processor that controls the motor, the transport mechanism, and the printing mechanism; a connector to which a cable for communicate with an external apparatus is coupled; a substrate that transmits a signal received via the connector to the print processor, the print processor and the connector being mounted on the substrate; a first metal plate that separates the substrate from the motor; a second metal plate disposed above the substrate, the second metal plate having a through-hole; a third metal plate; a fourth metal plate; a fifth metal plate; and a sixth metal plate. The first metal plate to the sixth metal plate surround the substrate. The cable is coupled to the connector via the through-hole. The through-hole is covered with a metal cover. Hereinafter, the embodiment will be described with reference to the accompanying drawings.

In this embodiment, the printing apparatus is an ink jet printer, which prints an image on a medium by discharging liquid (ink) onto the medium. However, the printing apparatus is not limited to an ink jet printer; alternatively, the printing apparatus may also be a dot impact printer, a thermal-transfer printer, a laser printer, or any other type of printer.

1. Functional Configuration of Printing Apparatus

Figure 1:
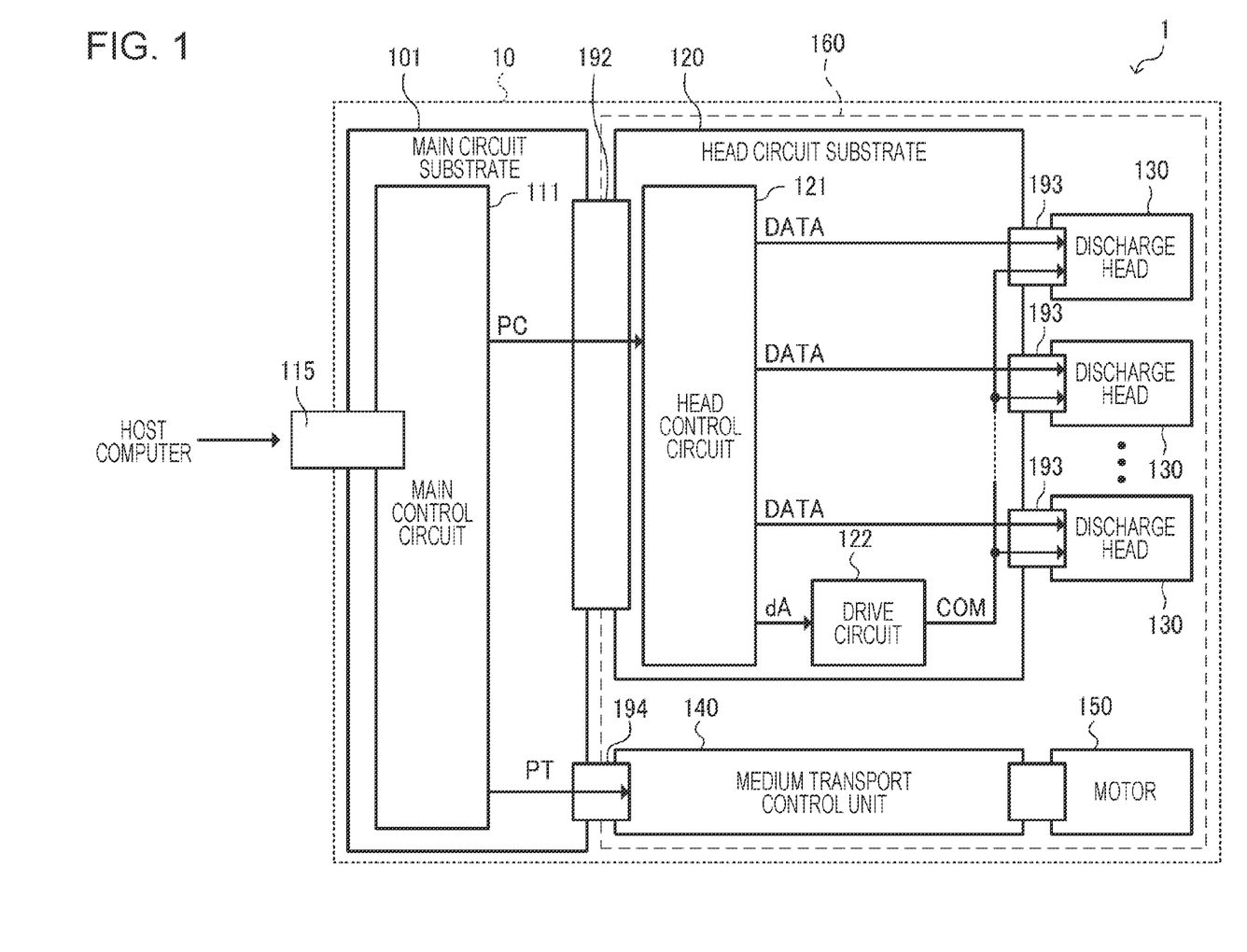
FIG. 1 illustrates a functional configuration of a printing apparatus according to an embodiment of the present disclosure.

FIG. 1 illustrates a functional configuration of a printing apparatus 1, which is an example of the printing apparatus according to this embodiment. As illustrated in FIG. 1, the printing apparatus 1 includes a printing unit 10. The printing apparatus 1 is configured to print a desired image on a medium by causing the printing unit 10 to place ink droplets on the medium at predetermined positions, based on print information received from a host computer (not illustrated).

In this embodiment, a medium on which an image is to be printed by the printing apparatus 1 is a sheet of paper. However, a medium to be used by the printing apparatus 1 is not limited to a sheet of paper; alternatively, the medium may also be a roll of paper. Furthermore, the material of the medium is not limited to paper; alternatively, the material may also be fabric, fiber, or plastic.

The printing unit 10 includes a main circuit substrate 101, a head circuit substrate 120, a plurality of discharge heads 130, a medium transport control unit 140, and a motor 150.

The main circuit substrate 101 includes a main control circuit 111 that outputs a control signal for use in controlling individual components in the printing apparatus 1. The main control circuit 111 is electrically connected to a connector 115 mounted on the main circuit substrate 101. The main control circuit 111 may be implemented by a system on a chip (SoC) including a central processing unit (CPU).

When receiving print information from a host computer via the connector 115, the main control circuit 111 transmits information on print to the head circuit substrate 120. More specifically, the main control circuit 111 mounted on the main circuit substrate 101 generates a signal for use in operating a printing mechanism 160 (see FIG. 4). In other words, a processor in the main control circuit 111 mounted on the main circuit substrate 101 generates a signal for use in operating the printing mechanism 160, based on an instruction transmitted through the cable 192.

The main control circuit 111 transports a medium on which a printing operation is to be performed, in accordance with the signal that has been received from the host computer via the connector 115. More specifically, the main control circuit 111 generates a transport control signal PT for use in transporting the medium on which the printing operation is to be performed and then transmits the transport control signal PT to the medium transport control unit 140 through a cable 194. When receiving the transport control signal PT from the main control circuit 111, the medium transport control unit 140 generates a drive control signal for use in controlling the driving of the motor 150 in accordance with the transport control signal PT and then transmits this drive control signal to the motor 150. When receiving the drive control signal, the motor 150 rotates so as to transport the medium in a predetermined direction.

In parallel with the above, the main control circuit 111 generates a print control signal PC for use in printing an image on a medium, based on the print information received from the host computer via the connector 115 and then transmits the print control signal PC to the head circuit substrate 120 through a cable 192.

The print control signal PC is supplied from the main control circuit 111 to a head control circuit 121 in the head circuit substrate 120. When receiving the print control signal PC, the head control circuit 121 generates a plurality of print data signals DATA for the respective discharge heads 130 in accordance with the print control signal PC; each of the discharge heads 130 discharges ink onto a medium through a plurality of nozzles. The head control circuit 121 then transmits the print data signals DATA to the discharge heads 130. In parallel with this, the head control circuit 121 also generates a base drive signal dA, based on which a drive signal COM is to be generated, in accordance with a print control signal PC received from the main control circuit 111. The head control circuit 121 then transmits the base drive signal dA to a drive circuit 122. When receiving the base drive signal dA from the head control circuit 121, the drive circuit 122 generates the drive signal COM, the waveform of which is specified by the base drive signal dA and then transmits the drive signal COM to the discharge heads 130.

Each of the discharge heads 130 includes: the plurality of nozzles through which ink is to be discharged onto a medium; and a plurality of drive elements that drive so as to discharge the ink through corresponding nozzles in accordance with the drive signal COM. The discharge heads 130 are electrically connected to the head circuit substrate 120 through respective cables 193. When receiving a print data signal DATA from the head control circuit 121, each discharge head 130 selectively forwards the drive signal COM received from the drive circuit 122 to the drive elements, in accordance with the print data signal DATA. More specifically, each discharge head 130 forwards the drive signal COM to the drive elements corresponding to the nozzles through which the ink will be discharged onto a medium but does not forward the drive signal COM to the drive elements corresponding to the nozzles through which the ink will not be discharged onto the medium. In this way, the ink is discharged through the nozzles corresponding to the drive elements that have received the drive signal COM, whereas no ink is discharged through the nozzles corresponding to the drive elements that have not received the drive signal COM. In short, the discharge heads 130 selectively forward the drive signal COM to the drive elements in accordance with the print data signals DATA received from the head control circuit 121, thereby discharging the ink at timings specified by the print data signals DATA and through the nozzles designated by the print data signals DATA.

In this embodiment, as described above, the printing apparatus 1 is configured such that, in accordance with the print information received from the host computer, the main control circuit 111 controls the transport of a medium via the medium transport control unit 140 and simultaneously controls the operation of the head control circuit 121 mounted on the head circuit substrate 120. It is thereby possible to distinguish the nozzles through which the ink will be discharged onto a medium from the nozzles through which the ink will not be discharged. In short, the main control circuit 111 controls both the transport of a medium and the discharge timing of the ink, thereby causing the discharge heads 130 to place ink droplets on the medium at desired positions, namely, to form dots thereon at those positions. In this way, the printing apparatus 1 can print a desired image on the medium.

Hereinafter, the head circuit substrate 120, which performs the printing operation on a medium under the control of the main circuit substrate 101, the plurality of discharge heads 130, the medium transport control unit 140, and the motor 150 are collectively referred to as the printing mechanism 160. In the printing unit 10, the main control circuit 111 mounted on the main circuit substrate 101 controls the operation of the printing mechanism 160, in accordance with input information. In this case, the main control circuit 111 mounted on the main circuit substrate 101 is an example of a print processor.

In the printing apparatus 1, the connector 115 may be a universal serial bus (USB) port or a local area network (LAN) port that is connectable to an external apparatus through a LAN/USB cable. The printing apparatus 1 may read image information stored in a storage medium, such as a hard disk or flash memory, to which the USB or LAN port is connected and then may perform the printing operation based on the image information. The printing apparatus 1 may further include a scanner unit that reads image information formed on a medium. In other words, the printing apparatus 1 may be a multifunction product (MFP) that forms an image on a medium and scans an image formed on a medium.

2. Structure of Printing Apparatus

Next, a structure of the printing apparatus 1 will be described below. Prior to the description of the structure of the printing apparatus 1, the backward and forward directions of the printing apparatus 1 are defined, respectively, as the +X and −X directions; the right and left directions of the printing apparatus 1 viewed from the front are defined, respectively, as the +Y and −Y directions; and the vertical directions, or the downward and upward directions, of the printing apparatus 1 are defined, respectively, as the +Z and Z directions.

Figure 2:
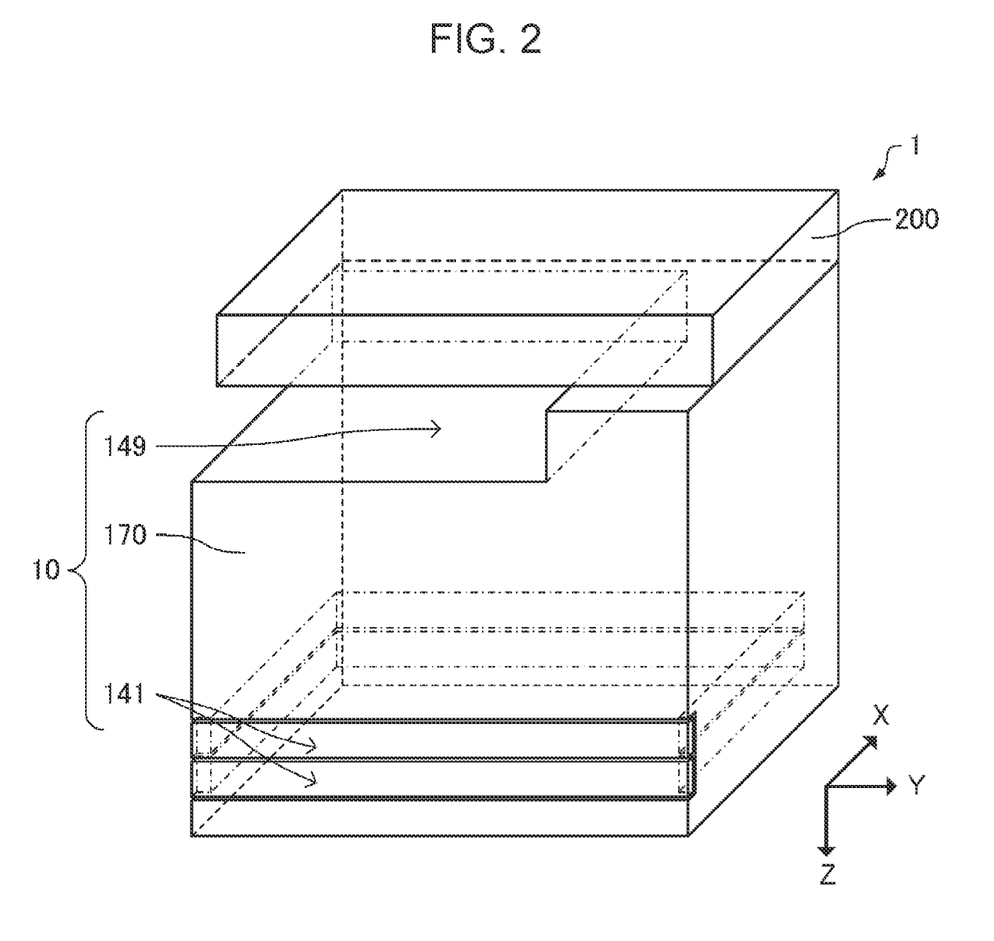
FIG. 2 illustrates an exterior structure of the printing apparatus.

FIG. 2 is a perspective schematic view of an exterior structure of the printing apparatus 1, which includes a scanner unit 200 in addition to the printing unit 10.

The printing unit 10 includes a plurality of medium containers 141, a medium ejection tray 149, and a housing 170. Each of the medium containers 141 reserves the inner space for storing a medium on which the printing operation is to be performed. More specifically, each medium container 141 is disposed close to the +Z-side of the housing 170 and slidably attached to the printing unit 10 so that the inner space can be at least partly contained in the housing 170. The medium ejection tray 149 is disposed on the Z-side of the housing 170 and receives a medium on which the printing operation has been performed.

Figure 4:
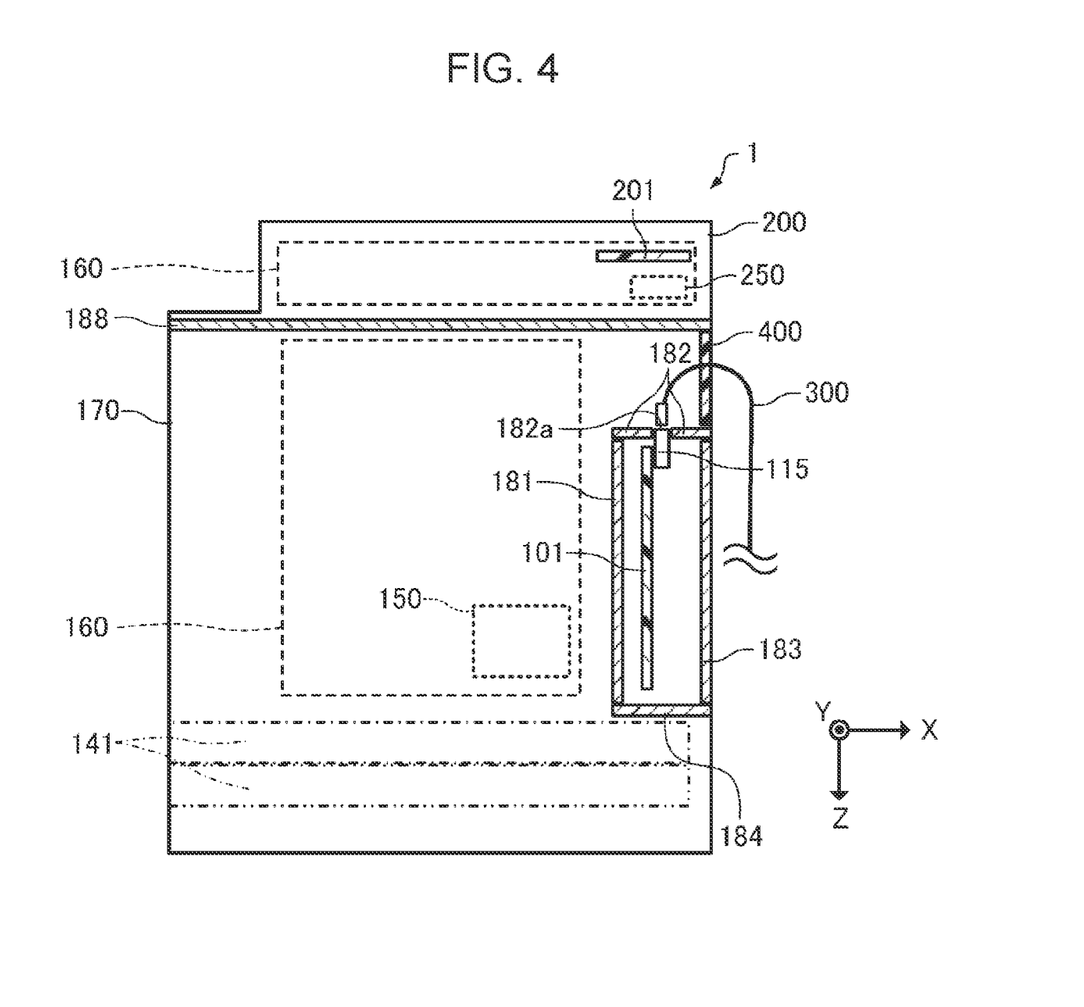
FIG. 4 illustrates an example of an internal structure of the housing.

As illustrated in FIG. 4, the scanner unit 200, which may be a flat head scanner, includes: an image pickup element (not illustrated), such as an image sensor; a scanner circuit substrate 201 including a scanner control circuit; and a motor 250 that drives the scanner. The scanner circuit substrate 201 includes a scanner processor that controls the scanner unit 200. The scanner unit 200 can read, as image data, an image, text, graph, or table recorded on a medium, such as a paper sheet, with the image pickup element. In short, the scanner unit 200 functions as an image reading apparatus.

When starting the printing operation, the printing apparatus 1 configured above feeds a medium stored in a medium container 141 and transports the medium inside the housing 170. The printing apparatus 1 then forms an image on the medium being transported and ejects the medium to the medium ejection tray 149.

Figure 3:
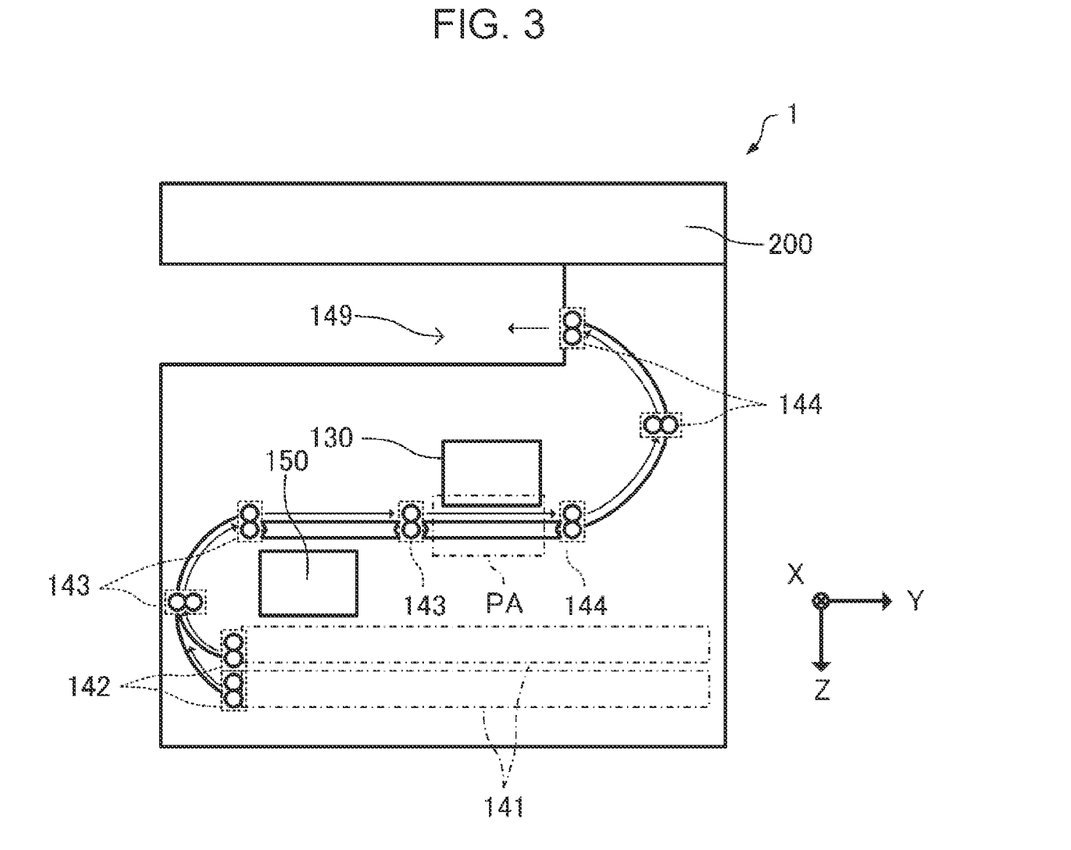
FIG. 3 illustrates an example of a route along which a medium is to be transported by a printing mechanism in the printing apparatus.

FIG. 3 illustrates an example of a route (referred to below as a transport route) along which a medium is to be transported by the printing mechanism 160 disposed inside the housing 170. As illustrated in FIG. 3, transport roller pairs 142, 143, and 144 are disposed inside the housing 170. Each of the transport roller pairs 142 to 144 includes a pair of drive and driven rollers. The drive and driven rollers of each of the transport roller pairs 142 to 144 pinch a medium while being rotated together by the motor 150, thereby transporting the medium in a predetermined direction.

More specifically, each transport roller pair 142 sequentially feeds media stored in the medium containers 141. It should be noted that, when sequentially feeding the media stored in the medium containers 141, each transport roller pair 142 may apply pressure to the media in the +Z direction. After one of the media has been ejected from a corresponding medium container 141, the transport roller pairs 143 feed the medium along the transport route while pinching the medium, thereby delivering the medium to a printing area PA facing the discharge heads 130. When the medium reaches the printing area PA, the discharge heads 130 place ink droplets on the medium at the timings specified by the print data signals DATA. After that, the transport roller pairs 144 feed the medium on which the ink droplets have been placed along the transport route while pinching the medium, thereby ejecting the medium to the medium ejection tray 149 outside the housing 170.

Figure 5:
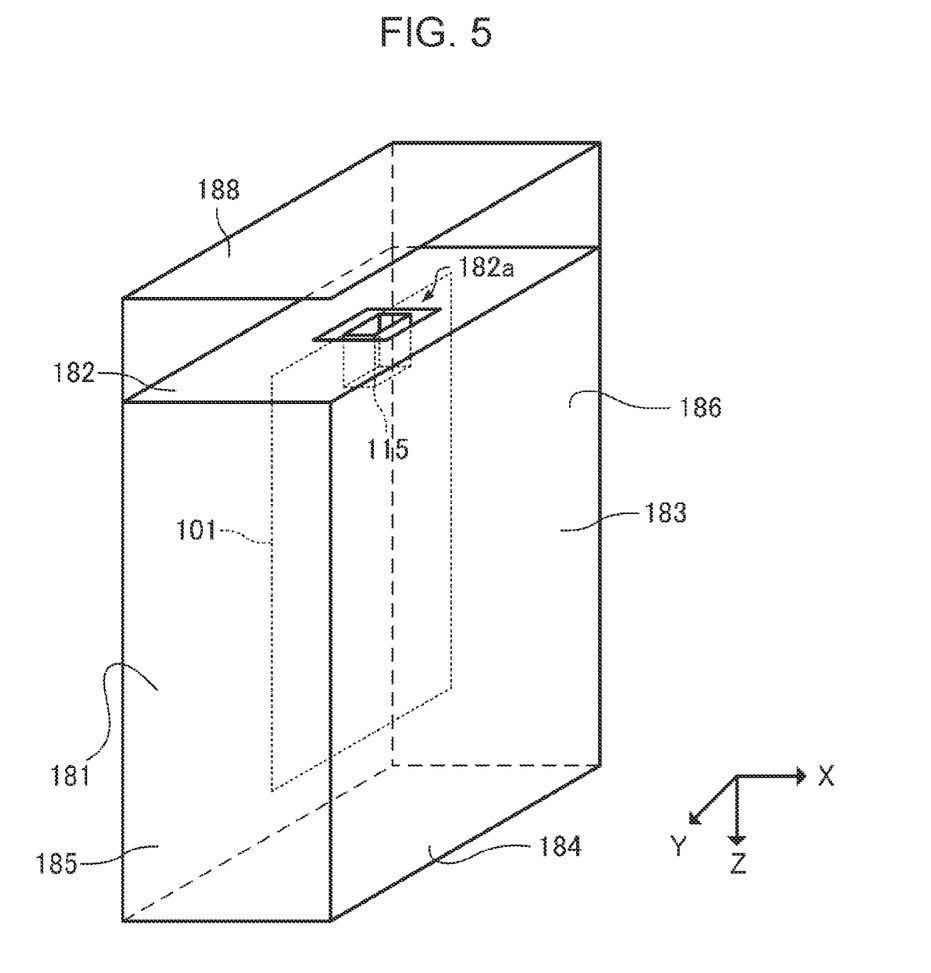
FIG. 5 is a perspective schematic view of the portion of the printing apparatus surrounding the main circuit substrate.

Next, an internal structure of the housing 170 in the printing unit 10 will be described below. FIG. 4 illustrates an example of an internal structure of the printing apparatus 1; FIG. 5 is a perspective schematic view of the portion of the printing apparatus 1 surrounding the main circuit substrate 101. It should be noted that FIG. 5 does not illustrate some members, such as a communication cable 300, a resin cover 400, and the housing 170, for the purpose of clearly indicating the members surrounding the main circuit substrate 101.

As illustrated in FIG. 4, the printing apparatus 1 contains the main circuit substrate 101 and the printing mechanism 160 in the housing 170. In addition, the main circuit substrate 101 is fixed to the housing 170 with its surfaces being parallel to the Y-Z plane.

As described above, the printing mechanism 160 incudes the motor 150. The printing apparatus 1 includes, inside the housing 170, a first metal plate 181, a second metal plate 182, a third metal plate 183, a fourth metal plate 184, a fifth metal plate 185, and a sixth metal plate 186. The first metal plate 181 separates the main circuit substrate 101 from the motor 150; the second metal plate 182 is disposed above (or on the Z-side of) the main circuit substrate 101 and has a through-hole 182a. It should be noted that FIG. 4 illustrates neither the fifth metal plate 185 nor the sixth metal plate 186.

The first metal plate 181 is disposed between the main circuit substrate 101 and the motor 150 (see FIG. 4) and faces the third metal plate 183 with the main circuit substrate 101 therebetween. The second metal plate 182 faces the fourth metal plate 184 disposed below (on the +Z-side of) the main circuit substrate 101 with the main circuit substrate 101 therebetween. The fifth metal plate 185 is disposed on a side (+Y-side) of the main circuit substrate 101 and faces the sixth metal plate 186 with the main circuit substrate 101 therebetween.

As described above, the first metal plate 181, the second metal plate 182, the third metal plate 183, the fourth metal plate 184, the fifth metal plate 185, and the sixth metal plate 186 (i.e., the first metal plate 181 to the sixth metal plate 186) surround the main circuit substrate 101 from the front, back, top, bottom, right, and left. Furthermore, a metal cover 188 covers the through-hole 182a formed in the second metal plate 182. The expression "a metal cover 188 covers the through-hole 182a" means that the metal cover 188 is disposed over the through-hole 182a so that a user cannot directly view the main circuit substrate 101 from the outside of the printing apparatus 1 through the through-hole 182a. In other words, the expression "a metal cover 188 covers the through-hole 182a" means that the metal cover 188 is disposed over the through-hole 182a so as to inhibit a user to view the main circuit substrate 101 from the outside of the printing apparatus 1 through the through-hole 182a.

As in the example of FIG. 4, the metal cover 188 serves as a structural member that supports the scanner unit 200. Thus, the printing apparatus 1 includes: the scanner unit 200 disposed above a connector 115 which scans a document; and the metal cover 188 that forms a portion of the scanner unit 200. Optionally, the printing apparatus 1 further includes a metal cover (not illustrated) dedicated to covering the through-hole 182a.

The metal cover 188 is disposed below the scanner circuit substrate 201 on which a scanner processor that controls the scanner unit 200 is mounted.

As illustrated in FIG. 4, the communication cable 300 is coupled, via the through-hole 182a, to the connector 115 mounted on the main circuit substrate 101. In this case, the connector 115 may be a right-angle connector into which a cable is insertable in the Z direction.

The material of each of the first metal plate 181 to the sixth metal plate 186 may be any metal or alloy that can attenuate an electromagnetic wave so as not to enter the main circuit substrate 101 and affect the operation thereof. By covering the main circuit substrate 101 with the first metal plate 181 to the sixth metal plate 186 in this manner, an external electromagnetic wave can be prevented from entering the main circuit substrate 101 as noise.

As illustrated in FIG. 4, a communication cable 300 for communication with an external apparatus is coupled to the connector 115 mounted on the main circuit substrate 101 via the through-hole 182a formed in the second plate 182. The shielding property of the through-hole 182a may be insufficient to sufficiently attenuate an external electromagnetic wave; however, disposing the metal cover 188 above the through-hole 182a can suppress the entry of an external electromagnetic wave in the connector 115 or the main circuit substrate 101, thereby reducing the generation of noise in the main circuit substrate 101.

As illustrated in FIG. 4, the printing apparatus 1 further includes the resin cover 400 having a notch through which the communication cable 300 passes. The resin cover 400 has a flat surface on the rear side (+X-side) of the printing apparatus 1. Disposing the resin cover 400 in this manner is effective in suppressing the entry of external dust in the connector 155 and providing the printing apparatus 1 with a good appearance.

In the example of FIG. 4, as a positional relationship of the individual members, the print processor (main circuit substrate 101), the connector 115, the resin cover 400, the metal cover 188, and the scanner processor (scanner circuit substrate 201) are arranged in this order in the direction opposite to the direction in which gravity acts. If a vertical horizontal plane, or a virtual plane parallel to the X-Y plane, is moved upward (i.e., in the direction from the +Z- to Z-sides), the print processor (main circuit substrate 101), the connector 115, the resin cover 400, the metal cover 188, and the scanner processor (scanner circuit substrate 201) are cut in this order by this vertical horizontal plane.

In the example of FIGS. 4 and 5, the first metal plate 181 to the sixth metal plate 186 have the same flat shape; however, they may have differently curved or uneven shapes. Each of the first metal plate 181 to the sixth metal plate 186 may be formed of a single metal sheet or may be formed by bonding two or more metal sheets together. In this example, the first metal plate 181 to the sixth metal plate 186 are arranged in such a way that all the side edges of one of the first metal plate 181 to the sixth metal plate 186 are in contact with corresponding side edges of the adjoining ones; however, they may be arranged in any given fashion unless an external electromagnetic wave causes noise to be generated in the main circuit substrate 101. Alternatively, the first metal plate 181 to the sixth metal plate 186 may be arranged apart from one another.

In the example of FIG. 4, the communication cable 300 is passed through the notch of the resin cover 400 and extended from the rear of the printing apparatus 1 to the outside. The communication cable 300, however, may be routed inside the housing 170 of the printing apparatus 1 and extended from one side or the bottom of the printing apparatus 1 to the outside. In this case, the printing apparatus 1 can be disposed with its rear being in contact with a wall, so that the footprint thereof can be decreased.

3. Function and Effect

In a printing apparatus 1 according to this embodiment, a main circuit substrate 101 is covered with a first metal plate 181 to a sixth metal plate 186. A communication cable 300 is coupled to a connector 115 mounted on the main circuit substrate 101 via a through-hole 182a formed in a second metal plate 182. The through-hole 182a is covered with a metal cover 188. This configuration, even if an electromagnetic wave is generated during the operation of a motor 150, suppresses the entry of this electromagnetic wave in the connector 115 or the main circuit substrate 101, thereby reducing the generation of noise in the main circuit substrate 101.

It should be noted that the foregoing embodiment and modifications are examples and thus not limited to such examples. It is obvious that these embodiment and modifications may be combined partially or in whole as appropriate.

The present disclosure may include a configuration equivalent to those described in the embodiment and modifications. More specifically, the present disclosure may include a configuration with a function, a method, a result, a purpose, and an effect equivalent to those described in the embodiment and modifications. Furthermore, the present disclosure may also include a configuration in which some optional components described in the embodiment and modifications are replaced with others. The present disclosure may also include a configuration that produces substantially the same effect as that described in the embodiment and modifications or that can accomplish substantially the same purpose as in the embodiment and modifications. The present disclosure may also include a configuration in which the components in the embodiment and modifications are combined with those in known related technique.

Hereinafter, the following subject matters can be derived from the foregoing embodiment and modifications.

A printing apparatus includes: a motor; a transport mechanism that transports a medium by virtue of power generated by the motor; a printing mechanism that prints an image on the medium being transported by the transport mechanism; a print processor that controls the motor, the transport mechanism, and the printing mechanism; a connector to which a cable for communicate with an external apparatus is coupled; a substrate that transmits a signal received via the connector to the print processor, the print processor and the connector being mounted on the substrate; a first metal plate that separates the substrate from the motor; a second metal plate disposed above the substrate, the second metal plate having a through-hole; a third metal plate; a fourth metal plate; a fifth metal plate; and a sixth metal plate. The first metal plate to the sixth metal plate surround the substrate. The cable is coupled to the connector via the through-hole. The through-hole is covered with a metal cover.

In a printing apparatus, a substrate is covered with a plurality of metal plates. A cable is coupled to a connector mounted on the substrate via a through-hole formed in one of the metal plates. The through-hole is covered with a metal cover. This configuration, even if an electromagnetic wave is generated during the operation of the motor, suppresses the entry of this electromagnetic wave in the connector or the substrate, thereby reducing the generation of noise in the main circuit substrate.

The above printing apparatus may further include a scanner that scans a document. The scanner may be disposed above the connector. The metal cover may form a portion of the scanner.

In a printing apparatus, members constituting a scanner can reduce the generation of noise in a connector or a substrate.

In a printing apparatus, the metal cover may be disposed below a substrate on which a scanner processor that controls the scanner is mounted.

In a printing apparatus, noise generated by a motor is suppressed from entering a scanner processor in a scanner.

The printing apparatus may further include a resin cover that covers the connector to which the cable is coupled. The print processor, the connector, the resin cover, the metal cover, and the scanner processor may be arranged in this order in a direction opposite to a direction in which gravity acts.

In a printing apparatus, noise generated by a motor is suppressed from entering in each processor.

What is claimed is:

1. A printing apparatus comprising:
   a motor;
   a transport mechanism that transports a medium by virtue of power generated by the motor;
   a printing mechanism that prints an image on the medium being transported by the transport mechanism;
   a print processor that controls the motor, the transport mechanism, and the printing mechanism;
   a connector to which a cable for communicating with an external apparatus is coupled;
   a substrate that transmits a signal received via the connector to the print processor, the print processor and the connector being mounted on the substrate;
   a first metal plate that separates the substrate from the motor;
   a second metal plate disposed above the substrate, the second metal plate having a through-hole;
   a third metal plate;
   a fourth metal plate;
   a fifth metal plate; and
   a sixth metal plate,
   the first metal plate to the sixth metal plate surrounding the substrate,
   the cable being coupled to the connector via the through-hole,
   the through-hole being covered with a metal cover.

2. The printing apparatus according to claim 1, further comprising a scanner that scans a document, the scanner being disposed above the connector, wherein
   the metal cover forms a portion of the scanner.

3. The printing apparatus according to claim 2, wherein
   the metal cover is disposed below a substrate on which a scanner processor that controls the scanner is mounted.

4. The printing apparatus according to claim 3, further comprising a resin cover that covers the connector to which the cable is coupled, wherein
   the print processor, the connector, the resin cover, the metal cover, and the scanner processor are arranged in this order in a direction opposite to a direction in which gravity acts.

5. The printing apparatus according to claim 1, wherein the substrate is mounted in a vertical position.

* * * * *